United States Patent
Alvarez et al.

[11] Patent Number: 5,362,990
[45] Date of Patent: Nov. 8, 1994

[54] CHARGE PUMP WITH A PROGRAMMABLE PUMP CURRENT AND SYSTEM

[75] Inventors: Jose Alvarez, Leander; Hector Sanchez; Gianfranco Gerosa, both of Austin, all of Tex.

[73] Assignee: Motorola, Inc., Schaumburg, Ill.

[21] Appl. No.: 70,186

[22] Filed: Jun. 2, 1993

[51] Int. Cl.[5] .................. H03K 3/01; H03K 5/13; H03L 5/00
[52] U.S. Cl. .................. 327/538; 327/156; 327/322; 327/536
[58] Field of Search ............ 307/578, 607, 264, 296.6, 307/268; 328/155

[56] References Cited

U.S. PATENT DOCUMENTS

| | | | |
|---|---|---|---|
| 4,680,488 | 7/1987 | Okumura | 307/578 |
| 4,896,297 | 1/1990 | Miyatake | 307/578 |
| 4,906,056 | 3/1990 | Taniguchi | 307/578 |
| 5,056,062 | 10/1991 | Kuwabara | 307/578 |

OTHER PUBLICATIONS

A Single-Chip, 1.2 GHZ, PLL Frequency Synthesizer Using Reduced Capacitance, Dual Gate, BICMOS Technology, Huehne; IEEE, May 6, 1992, pp. 24.3.1–24.3.5.

*Primary Examiner*—William L. Sikes
*Assistant Examiner*—Tiep H. Nguyen
*Attorney, Agent, or Firm*—Lee E. Chastain

[57] ABSTRACT

A charge pump has a reference circuitry (18, 20, 22), a first parallel current path (16), at least one second parallel current path (16), a mirror circuit (46), a sourcing circuitry (60, 62) and a sinking circuitry (50, 54, 66, 68). The first and the at least one second parallel current path sink current from a first node responsive to a predetermined voltage generated by the reference circuitry. The at least one second current path also operates responsive to a control signal. The mirror circuit generates a second predetermined voltage responsive to the total current sunk from the first node. The sourcing circuitry and the sinking circuitry sourcing and sinking a current from the output node, respectively, responsive to the second predetermined voltage and to a control signal. The disclosed charge pump may be incorporated into a phase locked loop circuit where constant stability parameters are desired.

13 Claims, 2 Drawing Sheets

CHARGE PUMP WITH A PROGRAMMABLE PUMP CURRENT AND SYSTEM

FIELD OF THE INVENTION

The present invention generally relates to charge pumps, and more specifically to a charge pump with a programmable pump current.

BACKGROUND OF THE INVENTION

Charge pumps are a class of circuits that deliver a known current to a node. Charge pumps are frequently used in phase locked loop circuits (hereafter simply PLLs). A PLL matches the phase and frequency of a self-generated clock signal to a reference clock signal. In a PLL, a charge pump sinks current, sources current or is in a high impedance state with respect to an output node responsive to the phase and frequency differences between the self-generated clock signal and the reference clock signal. A resistor and a capacitor are connected in series (an RC circuit) between the output node and ground. The output node is also connected to a gate of a transistor. By selectively sinking or sourcing current to the output node, the gate to source voltage of the transistor, and thus, the conductivity of the transistor may be adjusted. Typically, the transistor connects a voltage supply rail to the various sources of one or more inverters. The inverters are connected in series forming a ring oscillator. By adjusting the charge at the output node, the charge pump can adjust the propagation delay of a signal through the ring oscillator and, hence, the frequency of the self-generated clock signal.

Some PLLs match the phase and frequency of a self-generated clock signal that has a frequency which is some multiple of the reference clock signal frequency. This modification may be advantageous to data processing systems in which the data processor operates at some multiple of an input reference clock signal. This frequency multiplication may be accomplished by dividing the frequency of the self-generated clock signal before the self-generated clock signal is compared to the reference clock signal.

The frequency of a PLL's self-generated clock signal may be programmed dynamically by inserting a programmable divider in its path. A PLL incorporating such a divider may generate a clock signal with different frequencies depending upon the settings of the inserted divider circuit. The PLL has a set of stability parameters associated with it for each different divider setting. Generally, it is desirable to have each of these sets of parameters as close to every other set as possible. One method of maintaining a constant set of stability parameters is to vary the current that the charge pump sources or sinks to the output node and to the RC circuit. As described above, the voltage at the output node controls the frequency of the voltage controlled oscillator.

Known programmable current charge pumps have certain disadvantages associated with them. In general, they are slower, larger, require more power and have greater output capacitance than non-programmable charge pumps. Their use, to now, has been a compromise.

SUMMARY OF THE INVENTION

In accordance with the present invention, there is disclosed a charge pump having a programmable output current which substantially eliminates disadvantages of prior charge pumps.

A charge pump has a reference circuitry, a first parallel current path, at least one second parallel current path, a mirror circuit, a sourcing circuitry and a sinking circuitry. The first and the at least one second parallel current paths sink current from a first node responsive to a predetermined voltage generated by the reference circuitry. The at least one second current path also operates responsive to a control signal. The mirror circuit generates a second predetermined voltage responsive to the total current sunk from the first node. The sourcing circuitry and the sinking circuitry sourcing and sinking a current from the output node, respectively, responsive to the second predetermined voltage and to a control signal.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION OF A PREFERRED EMBODIMENT

Figure 1:
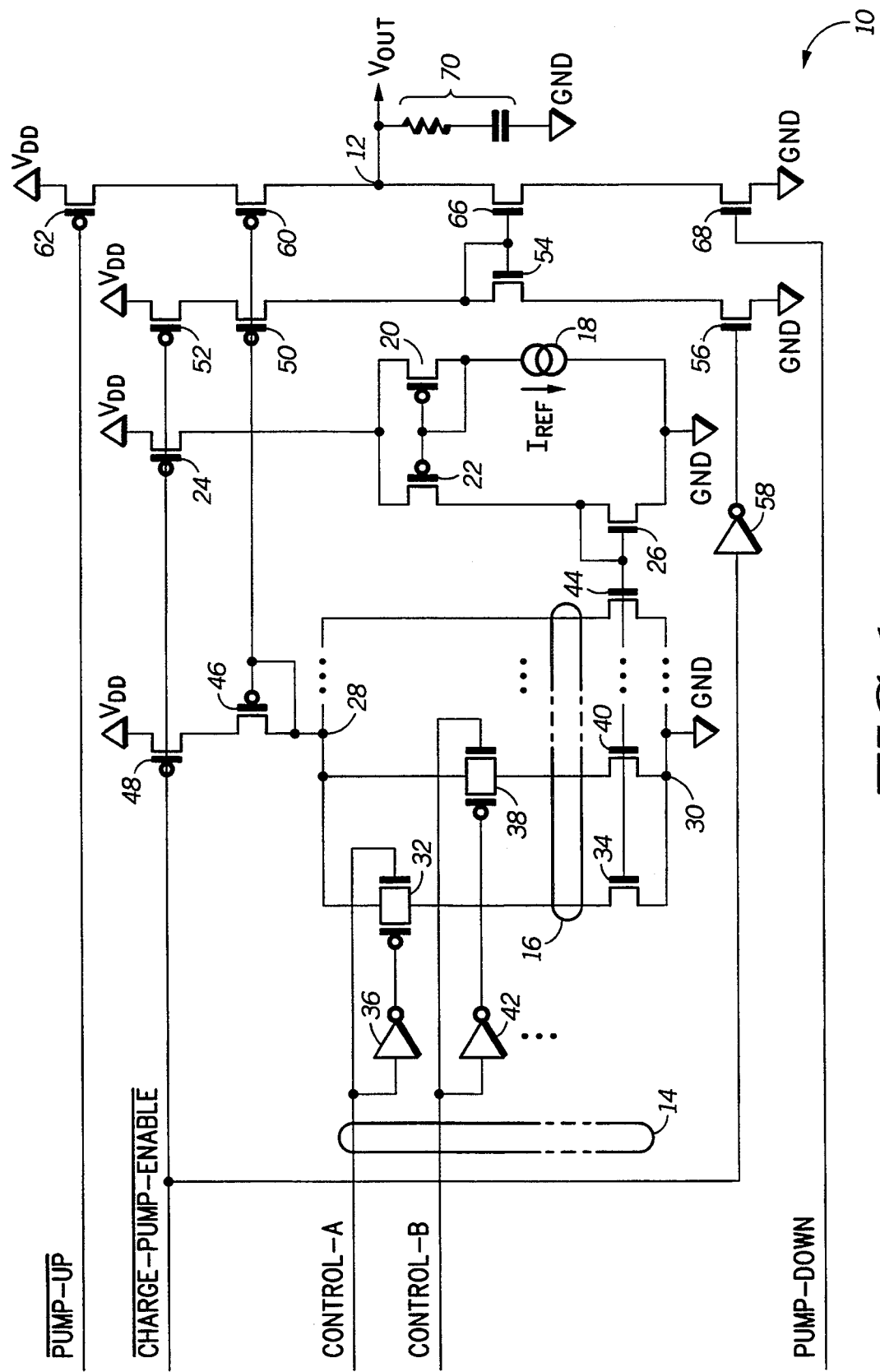
FIG. 1 depicts a partial schematic diagram of a programmable charge pump constructed in accordance with the present invention.

FIG. 1 depicts a partial schematic diagram of a programmable charge pump (hereafter simply pump) 10 constructed in accordance with the present invention. Pump 10 is operable to source or sink a known amount of current to an output node 12 for a given period of time. Pump 10 thereby dynamically controls the voltage present at output node 12 (labeled $V_{OUT}$). The current that pump 10 sources or sinks to output node 12 is programmable by a set of N logic signals 14 (labeled CONTROL-A, CONTROL-B, etc.) where N is a integer. Pump 10 has a plurality of parallel current paths 16. The amount of current that pump 10 sources or sinks is determined by the number and individual sizes of the enabled ones of these parallel current paths 16. Each one of the logic signals 14 enables or disables a selected differing one of the parallel current paths 16.

The amount of current that pump 10 sources or sinks to output node 12 may be advantageously used to maintain certain stability characteristics of a circuit incorporating pump 10 over a range of operating modes. These stability characteristics include the damping coefficient and natural frequency of a circuit incorporating pump 10. The location of parallel current paths 16 away from output node 12 allows pump 10 to turn on and off more quickly than known charge pumps. Also, the same set of parallel current paths is used to both source and sink current to output node 12. Prior charge pumps use two sets of parallel current paths: one set for sourcing current to an output node and one set for sinking current from the output node. The disclosed invention allows a charge pump to be designed with fewer transistors thus decreasing the pump's size.

Continuing with FIG. 1, a reference current generator 18 generates a reference current, $I_{REF}$. A first terminal of reference current generator 18 is connected to a drain and to a gate of a P-channel transistor 20. A second terminal of reference current generator 18 is connected to a terminal of a first voltage supply (labeled GND). The gate of transistor 20 is connected to a gate of a P-channel transistor 22. A source of transistor 20 is connected to a drain of a P-channel transistor 24. A gate and a source of transistor 24 are connected to a logic signal $\overline{\text{CHARGE-PUMP-ENABLE}}$ and to a terminal of a second voltage supply (labeled $V_{DD}$), respectively. A drain of transistor 22 is connected to a source of an N-channel transistor 26. A drain of transistor 26 is connected to a terminal of the first voltage supply. A gate of transistor 26 is connected to the source of transistor 26.

Each of the N parallel current paths 16 is connected in parallel between a first node 28 and a second node 30. The second node is connected to a terminal of the second voltage supply. Each current path has a switch and a transistor. The switch places the current path in a either a high impedance state or a conducting state. The transistor in each current path causes a known current to flow through the current path depending upon the transistor biasing. In the depicted embodiment, pump 10 has two such parallel paths and a third, modified current path. The third modified current path is always operating. It provides a minimum current output when pump 10 is operating.

The first current path has a switch or pass gate 32 and an N-channel transistor 34 connected in series. A first terminal of pass gate 32 is connected to first node 28. A second terminal of pass gate 32 is connected to a drain of transistor 34. A gate of transistor 34 is connected to the gate of transistor 26. A source of transistor 34 is connected to node 30. A P-channel device and an N-channel device of pass gate 32 are connected to an output of an inverter 36 and to the logic signal CONTROL-A, respectively. An input of inverter 36 is connected to the logic signal CONTROL-A.

The second current path has a switch or pass gate 38 and an N-channel transistor 40 connected in series. A first terminal of pass gate 38 is connected to first node 28. A second terminal of pass gate 38 is connected to a drain of transistor 40. A gate of transistor 40 is connected to the gate of transistor 26. A source of transistor 40 is connected to node 30. A P-channel device and an N-channel device of pass gate 32 are connected to an output of an inverter 42 and to the logic signal CONTROL-B, respectively. An input of inverter 36 is connected to the logic signal CONTROL-B.

The third current path only has an N-channel transistor 44. First node 28 is connected to a drain of transistor 44. A gate of transistor 44 is connected to the gate of transistor 26. A source of transistor 44 is connected to node 30.

The number of parallel current paths 16 may be increased, decreased and modified as described below to provide a pump 10 with a differing degree of output programmability.

First node 28 is connected to a drain and a gate of a P-channel transistor 46. A source of transistor 46 is connected to a drain of a P-channel transistor 48. A gate and a source of transistor 48 are connected to the logic signal $\overline{\text{CHARGE-PUMP-ENABLE}}$ and to a terminal of the second voltage supply, respectively. The gates of transistor 46 and 48 are connected to a gate of P-channel transistor 50 and to a gate of a P-channel transistor 52, respectively. A source of transistor 52 is connected to a terminal of the second voltage supply. A drain of transistor 52 is connected to a source of transistor 50. A drain of transistor 50 is connected to a drain and a gate of an N-channel transistor 54. A source of transistor 54 is connected to a drain of an N-channel transistor 56. A gate and a source of transistor 56 are connected to an output of an inverter 58 and to a terminal of the second voltage supply, respectively. An input of inverter 58 is connected to the logic signal $\overline{\text{CHARGE-PUMP-ENABLE}}$.

The gate of transistor 50 is also connected to a gate of a P-channel transistor 60. A source of transistor 60 is connected to a drain of a P-channel transistor 62. A gate and a source of transistor 62 are connected to a logic signal $\overline{\text{PUMP-UP}}$ and to a terminal of the second voltage supply, respectively. A drain of transistor 60 is connected to output node 12. Output node 12 is also connected to a drain of an N-channel transistor 66. A gate of transistor 66 is connected to the drain and to the gate of transistor 54. A source of transistor 66 is connected to a drain of an N-channel transistor 68. A gate and a source of transistor 68 are connected to a logic signal PUMP-DOWN and to a terminal of the first voltage supply, respectively. In the depicted embodiment, output node 12 is also connected to an RC circuit 70.

Charge pump 10 operates when the signal $\overline{\text{CHARGE-PUMP-ENABLE}}$ is asserted. Consistent with standard nomenclature, a superscript bar indicates an active low logic signal. When the signal $\overline{\text{CHARGE-PUMP-ENABLE}}$ is asserted, transistors 48, 24 and 52 are placed in a conducting state. Therefore, transistors 46, 22, 20 and 50 are connected to the second voltage supply. In addition, the signal $\overline{\text{CHARGE-PUMP-ENABLE}}$, inverted by inverter 58, places transistor 56 into a conducting state. Therefore, transistor 54 is connected to the first voltage supply. Charge pump 10 does not consume any power when the signal $\overline{\text{CHARGE-PUMP-ENABLE}}$ is not asserted. This feature is useful in at least two instances. First, this feature may be integrated into a power management scheme of a data processor incorporating charge pump 10. Second, the non-assertion of the signal $\overline{\text{CHARGE-PUMP-ENABLE}}$ may be used to detect any electrical short-circuits with charge pump 10. These short-circuits will consume power even when the signal $\overline{\text{CHARGE-PUMP-ENABLE}}$ is not asserted.

When the signal $\overline{\text{CHARGE-PUMP-ENABLE}}$ is asserted, charge pump 10 has three modes of operation: charge output node 12, discharge output node 12 and place output node 12 into a high impedance state. In each of these three modes of operation, transistor 46 mirrors a programmed voltage level to transistor 60 and 66. The generation of this programmed voltage level is described below. The voltage level present on the gate of transistor 46 causes a current to flow through transistor 60, through transistor 66, or through neither transistor.

The logic signals $\overline{\text{PUMP-UP}}$ and PUMP-DOWN determine in which of the three modes charge pump 10 operates. If the signal $\overline{\text{PUMP-UP}}$ is asserted and the signal PUMP-DOWN is not asserted, then transistor 62 will be in a conducting state and transistor 68 will be in a non-conducting state. Therefore, transistor 60 will source an amount of current to output node 12 determined by the voltage level present on the gate of transistor 46. If the signal $\overline{\text{PUMP-UP}}$ is not asserted and the signal PUMP-DOWN is asserted, then transistor 62 will be in a non-conducting state and transistor 68 will be in a conducting state. Therefore, transistor 66 will sink an amount of current from output node 12 determined by the voltage level present on the gate of transistor 46. If neither of the two signals is asserted, then both transistors 62 and 68 will be in a non-conducting state. Therefore, output node 12 is placed into a high impedance state. (The assertion of both $\overline{\text{PUMP-UP}}$ and PUMP-DOWN is an illegal state.)

Reference current generator 18 generates a reference current, $I_{REF}$, that flows through transistor 20. This reference current causes a gate-source voltage differential between the gate and source of transistor 20. This gate-source voltage of transistor 20 is determined by the reference current, $I_{REF}$, and the physical characteristics of transistor 20. As a result of the above described circuit configuration, the same gate-source voltage is created between the gate and source of transistor 22. This mirrored voltage differential causes the same current, $I_{REF}$, to flow through transistor 22 and through transistor 26. Therefore, the same gate-source voltage differential develops across transistor 26. The same gate-source voltage differential is mirrored to each of the transistors in each of the current paths 16. In the depicted embodiment, the gate-source voltage differential of each of transistors 34, 40 and 44 is equal to the gate-source voltage differential of transistor 26. Therefore, the reference current, $I_{REF}$, flows through each of the parallel current paths that is enabled by the logic signals CONTROL-A, CONTROL-B, etc. Transistor 44 is always enabled because its drain is connected directly to node 28

The current flowing through node 28 is the sum of the individual currents flowing through the parallel current paths 16. This current sum may be programmed by enabling certain of the parallel current paths 16. The programmable current causes a gate-source voltage differential at transistor 46 that is mirrored directly to transistor 60 and mirrored indirectly to transistor 66 through transistors 50 and 54.

The previous description assumes that the individual transistors depicted in FIG. 1 are identical. Identical transistors generate identical currents when biased with the same gate-source voltage differential. Embodiments of the disclosed invention with different assumptions are possible. For instance, each of the transistors within the parallel current paths 16 may be sized differently to generate a wider range of sum currents at node 28. As is known in the art, the size of a transistor relates to the dimensions of a transistor's gate. The ratio of gate sizes of three transistors in three parallel current paths each to transistor 26 might be one, two, and four. This ratio would allow the sum current at node 28 to vary from $I_{REF}$ to ($7*I_{REF}$) in increments of $I_{REF}$ depending upon the particular inputs to the three logic signals, CONTROL-A, CONTROL-B and CONTROL-C. Other transistor modifications may advantageously increase or decrease the effective output of reference current generator 18. The set of all possible output currents may be linearly scaled by increasing or decreasing the ratio of the sizes of certain other transistors. For instance, the size of transistor 26 may be halved with respect to transistors 34, 40, etc. This modification will double the current that flows through transistors 34, 40, etc. with respect to transistor 26. A charge pump with such a modification doubles the current sourced or sunk at output node 12 relative to a charge pump without the modification.

Transistors 52 and 56, respectively, ensure that transistors 60 and 66 are biased correctly. As described above, transistor 60 mirrors the current flowing through transistor 50 by having the same gate-source voltage differential. Similarly, transistor 66 mirrors the current flowing through transistors 54 by having the same gate-source voltage differential. However, the sources of both transistors 60 and 66 are not directly connected to a voltage supply terminal. In particular, transistor 60 is connected to the second voltage supply through transistor 62. Transistor 66 is connected to the first voltage supply through transistor 68. These connections, or their equivalent, are necessary to the operation of charge pump 10. Therefore, transistor 52 is connected between transistor 50 and the second voltage supply, and transistor 56 is connected between transistor 54 and the first voltage supply. The resulting circuit symmetry ensures that appropriate pairs of gate-source voltage differentials are identical.

The separation of node 28 from output node 12 has several advantages. First, the output of charge pump 10 is more responsive to changes in the logic signals $\overline{\text{PUMP-UP}}$ and PUMP-DOWN. The gate-source voltage of transistor 46 constantly biases transistors 60 and 66 when enabled by the logic signal $\overline{\text{CHARGE-PUMP-ENABLE}}$. Prior charge pumps bias the parallel current paths with the "pump-up" and "pump-down" logic signals. This approach requires additional time for the output node to begin sinking or sourcing current as each current mirror stage turns on. Second, the number of parallel current paths is halved. Charge pump 10 has a single set of parallel current paths that sink a programmable amount of current from node 28. However, parallel current paths 16 are connected to transistors 60 and 66 in such a way as to allow charge pump 10 to sink current from or source current to output node 12. Known programmable charge pumps require a first set of parallel current paths to sink current from an output node and a second set of parallel current paths to source current to the output node. The elimination of one set of parallel current paths results in a smaller charge pump 10. Third, the capacitance of the sources of transistors 60 and 66 is determined primarily by the widths of the drains of these transistors. The capacitance of prior charge pumps is determined by each of the drains in two sets of parallel current path transistors connected to the output node. Therefore, the disclosed charge pump has a smaller output capacitance. This reduction in capacitance allows charge pump 10 to charge/discharge the output node quicker or allows for a smaller reference current generator given the same performance criteria. Fourth, charge pump 10 may operate with a voltage differential of only 3.3 volts between power rails ($V_{DD}$ and GND). Known programmable charge pumps have been designed to be powered by a greater voltage differential.

Figure 2:
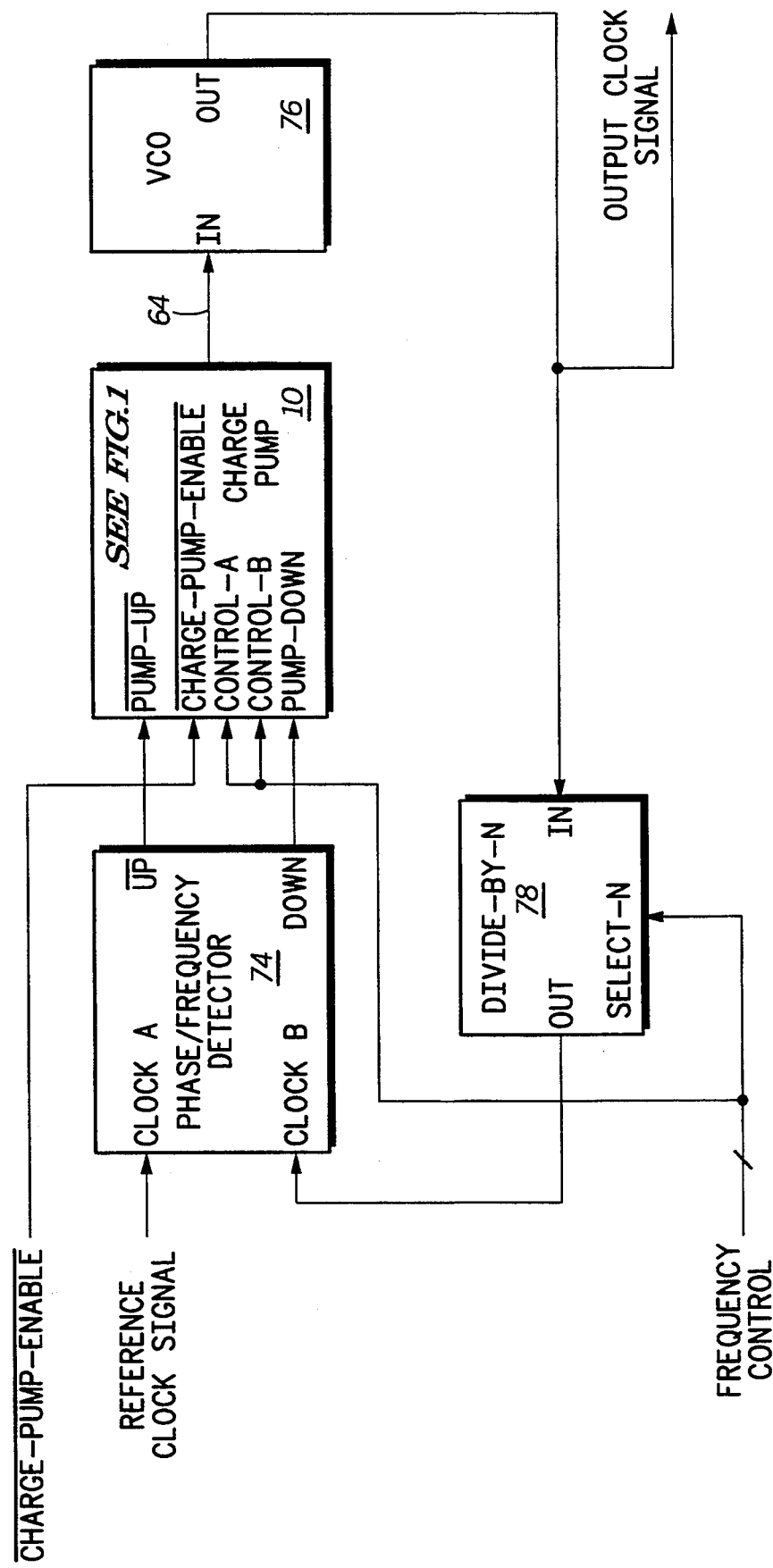
FIG. 2 depicts a block diagram of a phase locked loop incorporating the programmable charge pump depicted in FIG. 1.

FIG. 2 depicts a block diagram of a phase locked loop 72 incorporating programmable charge pump 10 depicted in FIG. 1. PLL 72 has a phase/frequency detector 74, charge pump 10, a voltage controlled oscillator (hereafter simply "VCO") 76, and a divide-by-N circuit 78.

The operation of phase/frequency detector 74, VCO 76 and divide-by-N circuit 78 individually are known by one skilled in the art. In general, PLL 72 generates an output clock signal, OUTPUT CLOCK SIGNAL that has a predetermined phase and frequency relationship to an input signal REFERENCE CLOCK SIGNAL. In particular, the clock signal output by divide-by-N circuit 78 is dynamically compared in phase and frequency to the reference clock signal, REFERENCE CLOCK. Phase/frequency detector 74 compares the two clock signals and provides $\overline{\text{UP}}$ and DOWN output signals. If the output clock signal has a lower frequency than the reference signal, then phase/frequency detector 74 asserts the $\overline{\text{UP}}$ signal. Conversely, if the output clock signal has a higher frequency than the reference clock signal, then phase/frequency detector 74 asserts the DOWN signal. When the two clock signals have substantially the same phase and frequency, then phase/frequency detector 74 asserts neither signal.

As described above in connection with FIG. 1, charge pump 10 charges or discharges output node 12 responsive to the output signals $\overline{\text{UP}}$ and DOWN of PLL 74. As depicted, the outputs $\overline{\text{UP}}$ and DOWN are connected to the charge pump inputs $\overline{\text{PUMP-UP}}$ and PUMP-DOWN, respectively. The input $\overline{\text{CHARGE-PUMP-ENABLE}}$ of charge pump 10 is connected to the signal labeled $\overline{\text{CHARGE-PUMP-ENABLE}}$. The inputs CONTROL-A, CONTROL-B, etc. of charge pump 10 are each connected to one of the signals within the group of signals labeled FREQUENCY CONTROL.

VCO 76 generates a periodic clock signal at its output, OUT, responsive to the analog voltage at its input, IN. The input IN is connected to output node 12 of charge pump 10. As described above, VCO 76 may have within it a ring oscillator. Generally, an increase in the voltage present on output node 12 causes the frequency of the output clock signal to increase. Conversely, a decrease in the voltage present on output node 12 causes the frequency of the output clock signal to decrease. Other embodiments may reverse the relationship between frequency and output node voltage.

PLL 72 may generate an output clock signal that has a frequency different from the reference clock signal with the addition of divide-by-N circuit 78. In particular, divide-by-N circuit 78 reduces the frequency of an input clock signal by a factor of N, where N is an integer. The frequency of OUTPUT CLOCK SIGNAL, $v_{OUT}$, is given by the relation:

$$v_{OUT} = Nv_{IN}$$

where N is the integer described above and where $v_{IN}$ is the frequency of REFERENCE CLOCK SIGNAL. The input SELECT-N of divide-by-N circuit 78 is connected to one or more of the signals labeled FREQUENCY CONTROL. These signals select the value of N.

PLL 72 may be characterized by at least two stability parameters: a damping coefficient, D, and a natural frequency, w. These parameters are functions of the integer N and of the output current of charge pump 10, I:

$$D \propto w \propto \sqrt{\frac{I}{N}}$$

As described above, it is desirable to maintain these parameters across as wide a range of configurations as possible. The output current of charge pump 10 may be programmed so that the ratio (I/N) is constant by enabling more or less of the parallel current paths depicted in FIG. 1. For instance, if the FREQUENCY CONTROL signals are selected so that N doubles from a first to a second time (the frequency of OUTPUT CLOCK SIGNAL doubles), then I may be doubled by enabling an additional number of parallel current paths. Consequently, the two stability parameters, D and w, will remain the same from the first to the second time.

Although the present invention has been described with reference to a specific embodiment, further modifications and improvements will occur to those skilled in the art. For instance, the designation of an electrode of a transistor as a source or drain is dependent upon the media in which a particular embodiment is made and upon the voltage supply connections. The disclosed invention may be implemented in media other than complementary metal oxide silicon (CMOS), such as bipolar and BiCMOS. Therefore, the terms source, drain and gate will be replaced with first current electrode, second current electrode and control electrode. It is to be understood therefore, that the invention encompasses all such modifications that do not depart from the spirit and scope of the invention as defined in the appended claims.

What is claimed is:

1. A charge pump comprising:
   reference circuitry for generating a first predetermined voltage;
   a first parallel current path coupled to a first node the first parallel current path being operable to sink a first current from the first node in response to the first predetermined voltage;
   at least one second parallel current path coupled to the first node, each of the at least one second current path being operable to sink a current from the first node in response to the first predetermined voltage and to a first selected control signal of a plurality of control signals,
   a mirror circuit coupled to the first node, the mirror circuit operable to generate a second predetermined voltage responsive to a total current sunk from the first node, wherein the mirror circuit comprises a first transistor comprising a first current electrode, a second current electrode and a control electrode, the first current electrode and the control electrode coupled to the first node;
   sourcing circuitry coupled to an output node and to the mirror circuit for sourcing a current to the output node in response to the second predetermined voltage and to a second selected control signal of the plurality of control signals, and
   sinking circuitry coupled to the output node and to the mirror circuit for sinking a current from the output node in response to the second predetermined voltage and to a third selected control signal of the plurality of control signals.

2. The charge pump of claim 1 wherein the sourcing circuitry comprises:
   a second transistor comprising a first current electrode, a second current electrode and a control electrode, the first current electrode coupled to a terminal of a first voltage supply, the control electrode coupled to the second selected control signal of the plurality of control signals; and
   a third transistor comprising a first current electrode, a second current electrode and a control electrode, the first current electrode coupled to the second current electrode of the second transistor, the second current electrode coupled to the output node, the control electrode coupled to the control electrode of the first transistor.

3. The charge pump of claim 2 wherein the sinking circuitry comprises:
   a fourth transistor comprising a first current electrode, a second current electrode and a control electrode, the control electrode coupled to the control electrode of the first transistor; and
   a fifth transistor comprising a first current electrode, a second current electrode and a control electrode, the first current electrode and the control electrode coupled to the first current electrode of the fourth transistor;
   a sixth transistor comprising a first current electrode, a second current electrode and a control electrode, the first current electrode coupled to the output node, the control electrode coupled to the control electrode of the fifth transistor; and
   a seventh transistor comprising a first current electrode, a second current electrode and a control electrode, the first current electrode coupled to the second current electrode of the sixth transistor, the second current electrode coupled to a terminal of a second voltage supply, the control electrode coupled to the third selected control signal of the plurality of control signals.

4. The charge pump of claim 3 wherein the sinking circuitry further comprises an eighth transistor comprising a first current electrode, a second current electrode and a control electrode, the first current electrode coupled to the second current electrode of the fifth transistor, the second current electrode coupled to a terminal of the second voltage supply, the control electrode coupled to a selected control signal of the plurality of control signals.

5. A charge pump comprising:
   reference circuitry for generating a predetermined voltage;
   a first node;
   a second node for receiving a first voltage supply;
   at least one parallel current path, each of the at least one parallel current path comprising:
      a first transistor comprising a first current electrode, a second current electrode and a control electrode, the first current electrode coupled to the second node, the control electrode coupled to the predetermined voltage; and
      a switch means comprising first and second terminals, the first terminal of the switch means coupled to the first node, the second terminal coupled to the second current electrode of the first transistor, the switch means being in a conductive state in response to a first logic state of a first selected control signal of a plurality of control signals and being in a high impedance state in response to a second logic state of the first selected control signal;
   a second transistor comprising a first current electrode, a second current electrode and a control electrode, the first current electrode and the control electrode coupled to the first node, the second current electrode receiving a second voltage supply;
   an output node;
   sourcing circuitry coupled to the output node and to the second node for sourcing a predetermined current to the output node in response to a voltage present at the control electrode of the second transistor and a second selected control signal of the plurality of control signals; and
   sinking circuitry coupled to the output node and to the second node for sinking the predetermined current to the output node in response to the voltage present at the control electrode of the second transistor and to a selected control signal of the at least one control signal.

6. The charge pump of claim 5 wherein the sourcing circuitry comprises:
   a third transistor comprising a first current electrode, a second current electrode and a control electrode, the first current electrode coupled to a terminal of the second voltage supply, the control electrode coupled to the second selected control signal of the plurality of control signals; and
   a fourth transistor comprising a first current electrode, a second current electrode and a control electrode, the first current electrode coupled to the second current electrode of the third transistor, the second current electrode coupled to the output node, the control electrode coupled to the control electrode of the second transistor.

7. The charge pump of claim 6 wherein the sinking circuitry comprises:
   a fifth transistor comprising a first current electrode, a second current electrode and a control electrode, the control electrode coupled to the control electrode of the second transistor;
   a sixth transistor comprising a first current electrode, a second current electrode and a control electrode, the first current electrode and the control electrode coupled to the first current electrode of the fifth transistor;
   a seventh transistor comprising a first current electrode, a second current electrode and a control electrode, the first current electrode coupled to the output node, the control electrode coupled to the control electrode of the sixth transistor; and
   an eighth transistor comprising a first current electrode, a second current electrode and a control electrode, the first current electrode coupled to the second current electrode of the seventh transistor, the second current electrode coupled to a terminal of the first voltage supply, the control electrode coupled to the third selected control signal of the plurality of control signals.

8. The charge pump of claim 7 wherein the sinking circuitry further comprises a ninth transistor comprising a first current electrode, a second current electrode and a control electrode, the first current electrode coupled to the second current electrode of the sixth transistor, the second current electrode coupled to a terminal of the first voltage supply, the control electrode coupled to a selected control signal of the plurality of control signals.

9. The charge pump of claim 8 wherein the reference circuitry comprises:
   a current generator having a first and a second terminal, the current generator causing a predetermined electrical current to flow from the first terminal to the second terminal, the second terminal coupled to a terminal of the first voltage supply;
   a tenth transistor comprising a first current electrode, a second current electrode and a control electrode;
   an eleventh transistor comprising a first current electrode, a second current electrode and a control electrode, the first current electrode and the control electrode coupled to the control electrode of the tenth transistor, the first current electrode also coupled to the first terminal of the current generator; and a twelfth transistor comprising a first current electrode, a second current electrode and a control electrode, the first current electrode and the control electrode coupled to the first current electrode of the tenth transistor, the second current electrode coupled to a terminal of the first voltage supply, the control electrode generating the predetermined voltage.

10. The charge pump of claim 9 further comprising:

a thirteenth transistor comprising a first current electrode a second current electrode and a control electrode, the first current electrode coupled to a terminal of the second voltage supply, the second current electrode coupled to the second current electrode of the second transistor, the control electrode coupled to another selected control signal of the plurality of control signals;

a fourteenth transistor comprising a first current electrode, a second current electrode and a control electrode, the first current electrode coupled to a terminal of the second voltage supply, the second current electrode coupled to the second current electrode of the fifth transistor, the control electrode coupled to said another selected control signal of the plurality of control signals; and a fifteenth transistor comprising a first current electrode, a second current electrode and a control electrode, the first current electrode coupled to a terminal of the second voltage supply, the second current electrode coupled to the second current electrodes of the tenth and eleventh transistors, the control electrode coupled to said another selected control signal of the plurality of control signals.

11. The charge pump of claim 8 further comprising:

a tenth transistor comprising a first current electrode, a second current electrode and a control electrode, the first current electrode coupled to a terminal of the second voltage supply, the second current electrode coupled to the second current electrode of the second transistor, the control electrode coupled to another selected control signal of the plurality of control signals; and a eleventh transistor comprising a first current electrode, a second current electrode and a control electrode, the first current electrode coupled to a terminal of the second voltage supply, the second current electrode coupled to the second current electrode of the fifth transistor, the control electrode coupled to said another selected control signal of the plurality of control signals.

12. A system comprising:

a detector for receiving a first clock signal and a second clock signal, the detector being operable to generate a subset of a plurality of control signals in response to a predetermined phase and frequency relationship of the first and second clock signals;

a charge pump coupled to the plurality of control signals, the charge pump comprising:

reference circuitry for generating a first predetermined voltage;

a first parallel current path coupled to a first node, the first parallel current path being operable to sink a first current from the first node in response to the first predetermined voltage;

at least one second parallel current path coupled to the first node, each of the at least one second current path being operable to sink a current from the first node in response to the first predetermined voltage and to a first selected control signal of the plurality of control signals;

a mirror circuit coupled to the first node, the mirror circuit operable to generate a second predetermined voltage responsive to a total current sunk from the first node, wherein the mirror circuit comprises a first transistor comprising a first current electrode, a second current electrode and a control electrode, the first current electrode and the control electrode coupled to the first node;

sourcing circuitry coupled to an output node and to the mirror circuit for sourcing a current to the output node responsive to the second predetermined voltage and to a second selected control signal of the plurality of control signals; and sinking circuitry coupled to the output node and to the mirror circuit for sinking a current from the output node in response to the second predetermined voltage and to a third selected control signal of the plurality of control signals; and a voltage controlled oscillator coupled to the output node of the charge pump, the voltage controlled oscillator operable to generate a third clock signal, the third clock signal characterized by a first frequency, the first frequency responsive to a voltage at the output node of the charge pump.

13. The charge pump of claim 12 further comprising a divide-by-N circuit for receiving the third clock signal, the divide-by-N circuit being operable to generate the second clock signal the second clock signal characterized by a second frequency, the ratio of the second and first frequencies is responsive to one of the plurality of control signals.

* * * * *